United States Patent
Sokolov et al.

[11] Patent Number: 5,867,034
[45] Date of Patent: Feb. 2, 1999

[54] NON-DESTRUCTIVE METHOD AND APPARATUS FOR MONITORING CARRIER LIFETIME OF A SEMICONDUCTOR SAMPLE DURING FABRICATION

[76] Inventors: Vladimir Sokolov, 1354 E. Wood Duck Trail, Shakopee, Minn. 55379; David C. Engelhardt, 3840 1st Ave. South, Minneapolis, Minn. 55409

[21] Appl. No.: 790,661

[22] Filed: Jan. 30, 1997

[51] Int. Cl.$^6$ .................................................. G01R 31/26
[52] U.S. Cl. ........................................... 324/765; 324/752
[58] Field of Search ................................... 324/765–769, 324/752, 637, 642

[56] References Cited

U.S. PATENT DOCUMENTS

| | | | |
|---|---|---|---|
| 3,939,415 | 2/1976 | Terasawa | 324/767 |
| 4,704,576 | 11/1987 | Tributsch et al. | 324/642 |
| 4,839,588 | 6/1989 | Jantsch et al. | 324/766 |
| 4,949,034 | 8/1990 | Imura et al. | 324/765 |
| 5,047,713 | 9/1991 | Kirino et al. | 324/752 |
| 5,049,816 | 9/1991 | Moslehi | 324/767 |
| 5,081,414 | 1/1992 | Kusama et al. | 324/642 |
| 5,196,786 | 3/1993 | Usami et al. | 324/765 |
| 5,406,214 | 4/1995 | Boda et al. | 324/765 |

Primary Examiner—Ernest F. Karlsen
Assistant Examiner—Anh Phung
Attorney, Agent, or Firm—Roger W. Jensen

[57] ABSTRACT

A non-destructive method for monitoring the carrier lifetime characteristic of a fabricated semiconductor sample during the fabrication process, where selected materials are deposited on a planar surface of a wafer substrate in a fabrication chamber, employs one or more viewports in the walls of a fabrication chamber, thus avoiding any alteration of the fabrication process. A focused electromagnetic wave is generated external to the fabrication chamber, and directed through a viewport to impinge upon a selected portion of the planar surface of the wafer substrate at an oblique incident angle relative to the planar surface of the wafer substrate. In turn, a reflected electromagnetic wave emanating from the planar surface of the wafer substrate is detected. A light source, also external to the fabrication chamber, generates light directed at the wafer substrate through a viewport. The light is intended to have wavelength components capable of generating hole-electron pairs in the wafer substrate. In turn, the dynamic response of the reflected electromagnetic wave, in response to the light being changed from a light on condition to a light off condition, is utilized for determining a quantity indicative of the carrier lifetime characteristic of the fabricated semiconductor sample.

14 Claims, 2 Drawing Sheets

NON-DESTRUCTIVE METHOD AND APPARATUS FOR MONITORING CARRIER LIFETIME OF A SEMICONDUCTOR SAMPLE DURING FABRICATION

FIELD OF THE INVENTION

The present invention relates generally to semiconductor manufacturing processes, and more particularly to a method and apparatus for monitoring carrier lifetime of a semiconductor sample during epitaxial layer growth, deposition or fabrication.

BACKGROUND OF THE INVENTION

Semiconductor manufacturing processing techniques are widely known, and include, among others, deposition of selected materials on a semiconductor wafer by epitaxial growth or other such techniques, both similar and diverse, for example molecular beam or ion-beam deposition. The so called "wafer" is commonly employed for formation thereon of either a singular sample, or a plurality of samples, each consisting of an arrangement of many components. Monitoring of a selected characteristic of the semiconductor wafer during the deposition process is of paramount importance so as to achieve quality devices without undue rejections or scrap. Examples of such selected characteristics are, among others, sheet resistivity and carrier lifetime.

Desirably, any monitoring of the semiconductors during the deposition process should be conducted if possible by a non-contact or non-destructive measurement technique or method that does not risk contaminating or damaging the semiconductor wafer. An example of such a technique is the use of microwaves to measure selected semiconductor properties or characteristics as particularly described in U.S. Pat. No. 5,103,182, entitled, "Electromagnetic Wave Measurement of Conductive Layers of a Semiconductor Wafer During Processing Fabrication In a Fabrication Chamber", issued to Moselehi. As described in the aforesaid patent, a microwave emitter and a microwave collector are employed within the confines of a semiconductor fabrication chamber. A microwave source, external to the semiconductor fabrication chamber, is coupled to the microwave emitter within the fabrication chamber. The microwave emitter is directed to impinge on the surface of a wafer in-process. In turn, microwave energy is reflected from the surface of the wafer and detected by the microwave collector waveguide thereby producing an output signal indicative of a selected characteristic of the wafer in-process.

Still another example is U.S. Pat. No. 5,451,886, entitled, "Method Of Evaluating Lifetime Of Semiconductor Material And Apparatus For The Same, issued to Ogita, et al, where a light source is employed to radiate a wafer surface, and a millimeter to submilimeter waveguide is used to supply the surface of the wafer with an electromagnetic wave generated by an oscillator, and for guiding a reflected wave from the surface thereof to a reflected wave detector.

Yet still another example is U.S. Pat. No. 5,430,386, entitled, "Method And Apparatus For Evaluating Semiconductor Wafer By Irradiation With Microwave And Excitation Light, issued to Morin, et al, where a light source is employed to radiate a wafer surface at the same time that microwaves are directed toward the surface and reflected therefrom. In turn, reflected microwave energy is detected to determine carrier lifetime.

Other examples include, among others, U.S. Pat. No. 5,142,224, entitled, "Non-Destructive Semiconductor Wafer Probing System Using Laser Pulses To Generate And Detect Millimeter Wave Signals", issued to Smith, et. al., where electrical signals are induced into the wafer for subsequent signal measurements indicative of the quality of the wafer; U.S. Pat. No. 5,228,776, entitled, "Apparatus For Evaluating Thermal And Electrical Characteristics In A Sample", issued to Smith, et al, where a modulated pump beam of radiation is employed for detecting characteristics of a semiconductor sample; and U.S. Pat. No. 4,842,686, entitled, "Wafer Processing Apparatus And Method", issued to Davios, et al, where ultraviolet radiation is generated with the semiconductor fabrication chamber by generating a plasma therein but remote from the face of the wafer.

Prior art systems similar to those described above are generally complex systems which are complex in design and not generally versatile to accommodate various fabrication conditions and requirements. Specifically, they cannot be used during fabrication.

However, a novel method and apparatus for monitoring sheet resistivity of a semiconductor substrate has been disclosed in a co-pending patent application, having Ser. No. 08/794,221, entitled, "Non-Destructive Method and Apparatus for Monitoring a Selected Semiconductor Characteristic of a Semiconductor Sample During Fabrication, in the name of Vladimir Sokolov, one of the applicants of the present inventions, and filed on even date herewith. There disclosed is a fabrication chamber modified to include quartz like windows or viewports. An mm-wave is generated outside a fabrication chamber and directed to pass through the viewport to impinge upon a wafer substrate during the fabrication process. In turn, a reflected mm-wave is detected by apparatus outside the fabrication chamber, signal processed, and a resistivity measurement is obtained.

SUMMARY OF THE INVENTION

An object of the present invention is to provide a non-destructive method and apparatus for monitoring carrier lifetime of a semiconductor sample during the fabrication process.

An object of the present invention is to provide a non-destructive method and apparatus capable of monitoring sheet resistivity of a semiconductor wafer and carrier lifetime during the fabrication process, particularly during an epitaxial growth process.

An object of the present invention is to provide a non-destructive method and apparatus for monitoring carrier lifetime of a semiconductor sample, and more particularly the wafer itself, during the fabrication process and which employs hardware components which are totally external to a semiconductor fabrication chamber.

Another object of the present invention is to provide a non-destructive method for monitoring carrier lifetime of a semiconductor sample during the fabrication process, and which is easily adaptable to an existing semiconductor fabrication chamber, and which employs hardware components intended to be totally external to the fabrication chamber, and will not alter the dynamics of the growth process, i.e., the method is noninvasive.

In the present invention, carrier lifetime of a semiconductor sample fabricated on a wafer substrate, and more particularly the wafer itself, is monitored by a non-destructive method and apparatus. Monitoring is done in real-time during deposition of selected materials on a planar surface of the wafer substrate. In accordance with the present invention, one or more viewports or windows are employed in the walls of a fabrication chamber. A focused electromagnetic wave is generated external to the fabrication chamber, and directed through a viewport to impinge upon a selected portion of the planar surface of the wafer substrate at an oblique incident angle relative to the planar surface of the wafer substrate. In turn, a reflected electromagnetic wave emanating from the planar surface of the wafer substrate is detected by a detector also external to the fabrication chamber. Additionally light is generated external to the fabrication chamber and directed, at least in part, toward a semiconductor wafer in-process. The light is varied between on and off conditions resulting in responsive variations in the reflected electromagnetic wave, i.e., a dynamic response. In turn, a signal processor is employed to monitor and analyzed the dynamic response of the reflected electromagnetic wave caused by the light varying between the on and off conditions so as to determine a characteristic of the dynamic response which is indicative of the carrier lifetime of the fabricated semiconductor sample during the fabrication process, and more particularly to a portion (i.e., spatially localized) of the wafer's deposition surface during the fabrication process. Further, the signal processor may be also utilized to determine a reflection coefficient as a function of a selected characteristic of the focused electromagnetic wave and the reflected electromagnetic wave, e.g., power, so as to produce an indication of the sheet resistivity of the same wafer portion, also during the fabrication process.

DETAILED DESCRIPTION OF THE INVENTION

Figure 1:
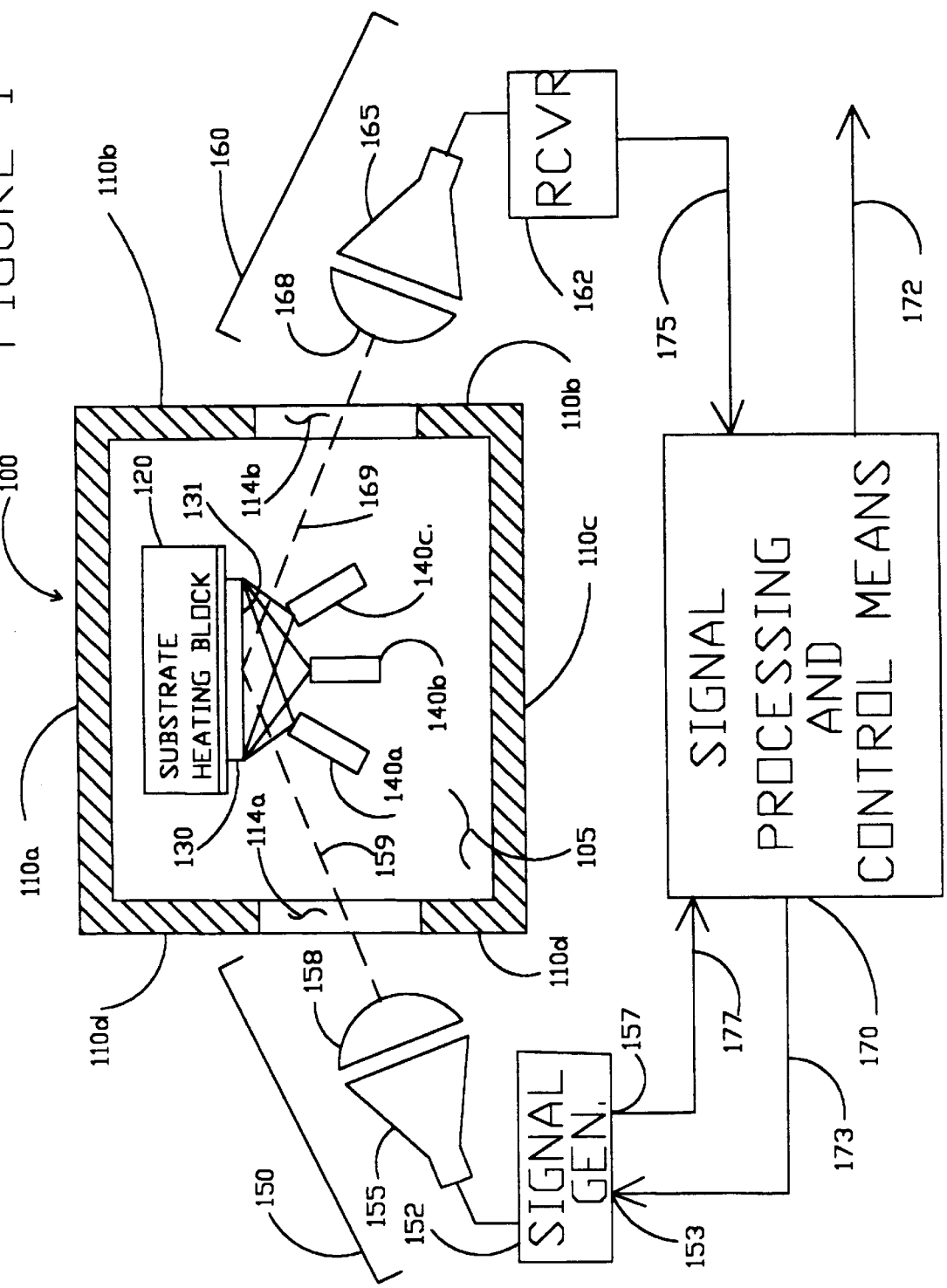
FIG. 1 is a partially broken away diagrammatic view of a semiconductor wafer fabrication chamber and schematic block diagram of a non-invasive semiconductor monitoring apparatus in accordance with the present invention.

FIG. 1 depicts a non-invasive semiconductor wafer monitoring apparatus intended for monitoring a selected fabricated sample characteristic during deposition of a material which is being deposited or grown on a planar surface of a wafer substrate for example by epitaxial growth, in real-time. The wafer substrate is commonly constructed of a semiconductor material, e.g., silicon, gallium arsenide, and the like.

There is shown in FIG. 1 an example of a deposition chamber, relevant to molecular beam epitaxial deposition. It consists of a generally vacuum tight semiconductor fabrication enclosure or housing 100 having, at least, closed wall members 110a–d which form, in part, fabrication chamber 105. Enclosed within fabrication chamber 105 is a substrate heating block 120 in close proximity to a wafer or wafer substrate 130 upon which various materials may be deposited or grown on a planar surface 131 thereof, for example by epitaxial growth. Within fabrication chamber 105 may be a plurality of vapor sources 140a–c (three shown, more or less are possible), each for evaporating a unique material in order to grow a thin crystalline material on the planar surface 131 of the wafer substrate in a manner well known in the art. The arrangement of fabrication chamber 105, substrate heating block 120, wafer 130, and vapor sources 140a–c are, of course, well known in the art for epitaxial growth deposition systems.

Further shown in FIG. 1 are additional components which comprise the non-invasive semiconductor monitoring apparatus in accordance with the present invention for monitoring a selected characteristic of a material which is being deposited or grown on substrate 130, and more specifically obtain a signal representation of conductance or sheet resistivity of the substrate 130 whereby carrier lifetime may be determined.

First, fabrication housing or enclosure 100 further comprises windows 114a and 114b strategically positioned in a manner as will be subsequently described. External to fabrication chamber 105 and enclosed substrate 130 is a focused beam electromagnetic wave generator 150, electromagnetic wave detector or collector 160, and signal processing and control means 170.

Focused beam electromagnetic wave generator 150, commonly known in the art, is illustrated in FIG. 1 as being comprised of a signal generator 152, coupled to a transmitting antenna or horn 155. In turn, horn 155 directs electromagnetic wave energy through an electromagnetic wave focusing or collimating lens 158. Electromagnetic wave collector 160, also commonly known in the art, is illustrated in FIG. 1 as being comprised of focusing or wave directing lens 168, receiving antenna or horn 165 connected to an electromagnetic wave signal receiver 162.

Signal generator 152, in an exemplary embodiment of the present invention, includes input means 153 for receiving a generator command signal on signal line 173, and an output means 157 for proving a generator output signal on signal line 177. The generator output signal is intended to be representative of the amplitude or power of a focused or collimated electromagnetic wave generally produced by focused beam electromagnetic wave generator 150, the output of which is generally indicated in the Figure by or beam 159. Signal generator may provide continuous or pulsed electromagnetic waves either free running or under control of the generator command signal.

Electromagnetic wave signal receiver 162 is intended to provide a receiver output signal on signal line 175, presented as an input to signal processing and control means 170. The receiver output signal is intended to be representative of any electromagnetic wave of a selected frequency or range of frequencies as collected by electromagnetic wave collector 160.

Signal processing and control means 170 is intended to receive input signals on signal lines 175 and 177, namely the generator output signal and the receiver output signal, respectively. Further, signal processing and control means may also include means for providing the generator command signal on signal line 173, or alternatively may be omitted if signal generator 152 is self running.

Signal processing and control means 170 is intended to include a microprocessor, computer, or the like for operating on (i) input signal samples of the generator output signal from signal generator 152 on signal line 177, and (ii) input signal samples of the receiver output signal from signal receiver 162 on signal line 175 for producing an output signal or signal indication, identified in the Figure by numeral 172, which is representative of a selected signal characteristic of the semiconductor wafer during the deposition process in a manner as will subsequently be described.

The operation of a non-invasive semiconductor monitoring apparatus for obtaining a signal representative of the conductance or sheet resistivity of the semiconductor sample will now be briefly described. Focused beam electromagnetic wave generator 150 forms a focused or collimated beam 159, an electromagnetic wave, to emanate from lens 158, pass through window 114a, and impinge upon a portion of planar surface 131 of wafer substrate 130 at an oblique angle thereto. Herein, focused beam 159 may also be referred to as incident beam 159 indicating that focused beam 159 is directed to impinge upon a portion of planar surface 131 of wafer substrate 130. The portion or specific size of the illuminated area of planar surface 131 of wafer substrate 131, illuminated by the focused or collimated beam, is generally determined by the focusing or collimating characteristic of the impinging or incident beam 159.

In turn, a reflected electromagnetic wave, herein referred to as reflected beam 169, the reflection of incident beam 159 from the planar surface 131 of wafer substrate 130 with materials grown thereon, emerges from the planar surface 131. Reflected beam 169 emerges from planar surface 131 at substantially a reflection angle equal to the incident beam angle, i.e., the angle between the planar surface 131 and the incident beam 159.

In turn, portions of reflected beam 169 pass through window 114b and impinge upon electromagnetic wave detector 160. More specifically, the reflected beam 169 impinges upon focusing lens 168 coupled to receiving antenna 165 for subsequent detection by signal receiver 162. In turn, signal receiver 162 provides an output signal on signal line 175 representative of the reflected electromagnetic wave beam 169.

Thus, as described, viewport 114a is in the line-of-sight of the planar surface 131 of the wafer substrate 130 by which the focused electromagnetic wave beam 159 propagates. Similarly, viewport 114b is positioned such that the reflected electromagnetic wave beam 169 propagates through viewport 114b. As should be obvious to those skilled in the art, the position of the viewports 114a–b in the walls of the fabrication chamber 105 is of course dependent upon the geometric relationships between the position of the planar surface 131 of wafer substrate 130 relative to the position of the path of the incident beam 159 and expected path of reflected beam 169.

It should also be recognized by those skilled in the art that viewport 114b may be replaced by a wave reflector(s) to direct the reflected beam 159 back through viewport 114a toward lens 158 and transmitting antenna 155 in order to obtain the desired information—namely a ratio of incident focused electromagnetic wave and reflected wave to obtain the reflection coefficient to yield sheet resistivity or other such characteristic. This, of course, eliminates the need for the second viewport 114b. By use of directional coupling techniques, antenna 155 may serve as a transmitting and receiving antenna so as to provide detection of a reflected electromagnetic wave derived from reflected beam 169. However, possibly associated with this approach is the inclusion of additional wave scattering and error sources which may degrade desired performance.

For a determination of sheet resistivity of the wafer, signal processing and control means 170 is intended to determine the ratio of the power of the reflected beam 169 and the incident beam 159. This ratio is indicative of the sheet resistivity as will subsequently be described. Accordingly, signal processing and control means 170 operates on the generator output signal on signal line 177 and receiver output signal on signal line 175 for determining the aforesaid ratio, respectively.

In the following description of an exemplary embodiment of the sheet resistivity monitor, it should be recognized by those skilled in the art of electromagnetic waves, that various aspects of the monitor are determined based on intended need, particularly the wafer characteristic intended to be determined, as well as the size of the wafer, the dimensions of the chamber employed, the wavelength of the incident beam, and the like.

Consider the scenario where the fabrication chamber 105 is a cubical chamber having dimensions 1 ft×1 ft×1.5 ft, it being recognized that other chambers may, of course, have greater or lesser volume. Assuming incident beam 159 is intended to impinge upon the center of a 3 inch diameter wafer, it would be desirable to have the incident beam have a diameter which creates a beam waist at the plane of the wafer to be about 1 inch, thereby obtaining a characteristic measurement having resolution being about the average of four quadrants of the wafer.

The incident beam power of incident beam 159 is intended to be in the order of 10 milliwatts or other value being large enough to obtain a good signal-to-noise ratio for the measurement as will be described. As should be understood, the required power of the incident beam is, of course, dependent upon the quality and other characteristics of the electromagnetic receiver 160 and signal processing and control means 170.

In the exemplary embodiment of the invention, windows or viewports 114a–b are intended to be dielectric windows, for example quartz or sapphire, having a selected thickness substantially equal to an integral number of "half" wavelengths of the wavelength of the incident beam generated by the focused beam electromagnetic wave generator 150. For example at a 105 GHz incident beam frequency, the thickness of windows 114a–b should be 0.242 inches. However, since a commercially available quartz viewport is 0.250 inches, the incident beam should be a frequency of 102.9 GHz. Such a commercially available viewport may be obtained from MDC Vacuum Products Corp., Hayward Calif., for example Viewport Reference No. VP-500QZ which is a quartz viewport of the aforesaid 0.250 inch thickness, and having a diameter of 3.88 inches—the minimum diameter of the window being of course dictated by the diameter of the incident beam 159 or reflected beam 169.

In an exemplary embodiment of the invention, the frequency of the incident electromagnetic wave beam 159 should be in the order of 100 GHz, although successful results have been obtained at 38 GHz. Generally, a good mm-wave frequency is desired. Choice of 100 GHz provides a good compromise between a reasonably small antenna aperture so as to require a reasonably small windows 114a–b, and relative good sensitivity. Although higher frequencies are, of course, possible, equipment may become prohibitively more expensive, and instrumentation mechanical tolerance become more critical.

It should also be noted that the choice of frequency for incident beam 159 is dependent upon the desire to achieve good spatial resolution on the semiconductor wafer surface. Secondly, the choice of frequency also effects the requirements for the antenna and viewports, i.e., windows 114a–b, which are compatible with the fabrication chamber 105. With the choices of frequency indicated above, short wavelengths at the mm-wave frequencies, the incident beam 159 may be focused on planar surface 131 of wafer 130 with the majority of the energy concentrated in an area of about 1 square centimeter. Consequently, resolution is high and diffractive effects at the edge of the wafer are minimized for typical semiconductors.

Signal processing and control means 170 operates on the aforesaid input signals and, in general, is intended to provide an output indicative of a selected wafer characteristic by determining a "beam reflection coefficient" as a function of the magnitude of the energy or power of the reflected beam 169 and the energy or power of the incident beam 159, and subsequently calculate a selected monitored characteristic value indicative of the selected characteristic of the wafer intended to be monitored, e.g., sheet resistivity. Signal processing and control means 170 is further configured to provide an output signal or signal indication 172 representative of the selected wafer characteristic, which of course make take the form of a numeric display, digital signal, or the like.

The beam reflection coefficient is, of course, a complex number having a magnitude which is the ratio of the amplitude of the reflected beam to the amplitude of the incident beam, and having a phase angle being the phase difference between the phase of the signal of the incident beam 159 and the phase of the signal of the reflected beam 169. However, the ratio, alone, of the amplitude, and therefore powers of the incident and reflected beams is generally sufficient to obtain desired information, e.g. wafer sheet resistivity.

It can be shown for the special case where a measurement of wafer sheet resistivity is desired, the reflection coefficient $R_{//}$ for parallel polarization beam components of the incident and the reflected beams, 159 and 169, respectively, when the reflection is from a two layer medium (a good approximation of a wafer's epitaxial layer and the wafer substrate) is given by:

$$R_X = (K_0 - Z_1)/(K_0 + Z_1)$$

Where $Z_1$ is the surface impedance, and $K_0$ is the electromagnetic wave impedance for an electromagnetic wave impinging on the surface of the wafer and is given by:

$$K_0 = \eta_0 \cos \theta_0 - (377 \cos \theta_0) \text{ohms}$$

generalized for an oblique incident angle $\theta_0$.

Note that this takes on the standard form for the expression of the reflection coefficient of a transmission line except that for the intended application it is dependent on the angle of incidence and the wafer's sheet resistivity characteristic $R_S$, through the surface impedance $Z_1$ given by:

$$Z_1 = K_1 [K_2 + K_1 \tan h(u_1 h)/(K_1 + K_2 \tan h(u_1 h)]$$

where the K's are the respective generalized wave impedance of the media:

$$K_m = u_m / j \omega \epsilon_m$$

with $m = 0, 1, 2$ and $$u_1 = [j \omega u_0 / h R_s + \beta_0 \sin^2 \theta_0]^{0.5}$$

where $u_0$ is the free space permeability and $\beta_0$ is the free space propagation constant. These expressions may be used directly as part of a computer calculation incorporated as part of signal processing means and control means 170, or may be simplified for the case where the epitaxial layer is thin (h goes to small values).

In the above mathematical analysis, $R_{//}$, the reflection coefficient is in terms of sheet resistivity $R_S$. As is well understood in the art, a computer program may be generated to yield the desired result, i.e., determined the sheet resistivity from the reflection coefficient—again, noting that the reflection coefficient is empirically determined by the output of receiver 162 and output of signal generator 152. Signal processing and control means may be embodied by a computer, PC, microprocessor, or the like to provide the intended mathematical functions, as well as provide power control of the signal generator 152 within pre-selected boundaries as desired.

Therefore, in operation of the embodiment of the invention illustrated in the Figure, signal processing and control means 170 operatively samples the power of the incident beam 159 emanating from signal generator 152 of pre-known power indicated by the generator output signal on signal line 177. The incident beam 159 is reflected from wafer 130 resulting in a reflected beam 169 detected by and converted by signal receiver 162. Receiver 162 provides a receiver output signal on signal line 175 representative of the power of reflected beam 169. In turn signal processing and control means 170 operates on the values of the known power of the incident beam 159 and the power of the reflected beam 169 to empirically determine a value, for example the ratio of the signal powers, representative of a selected characteristic of the wafer, e.g., sheet resistivity, and subsequently provide an output 172 indicative thereof.

Figure 2:
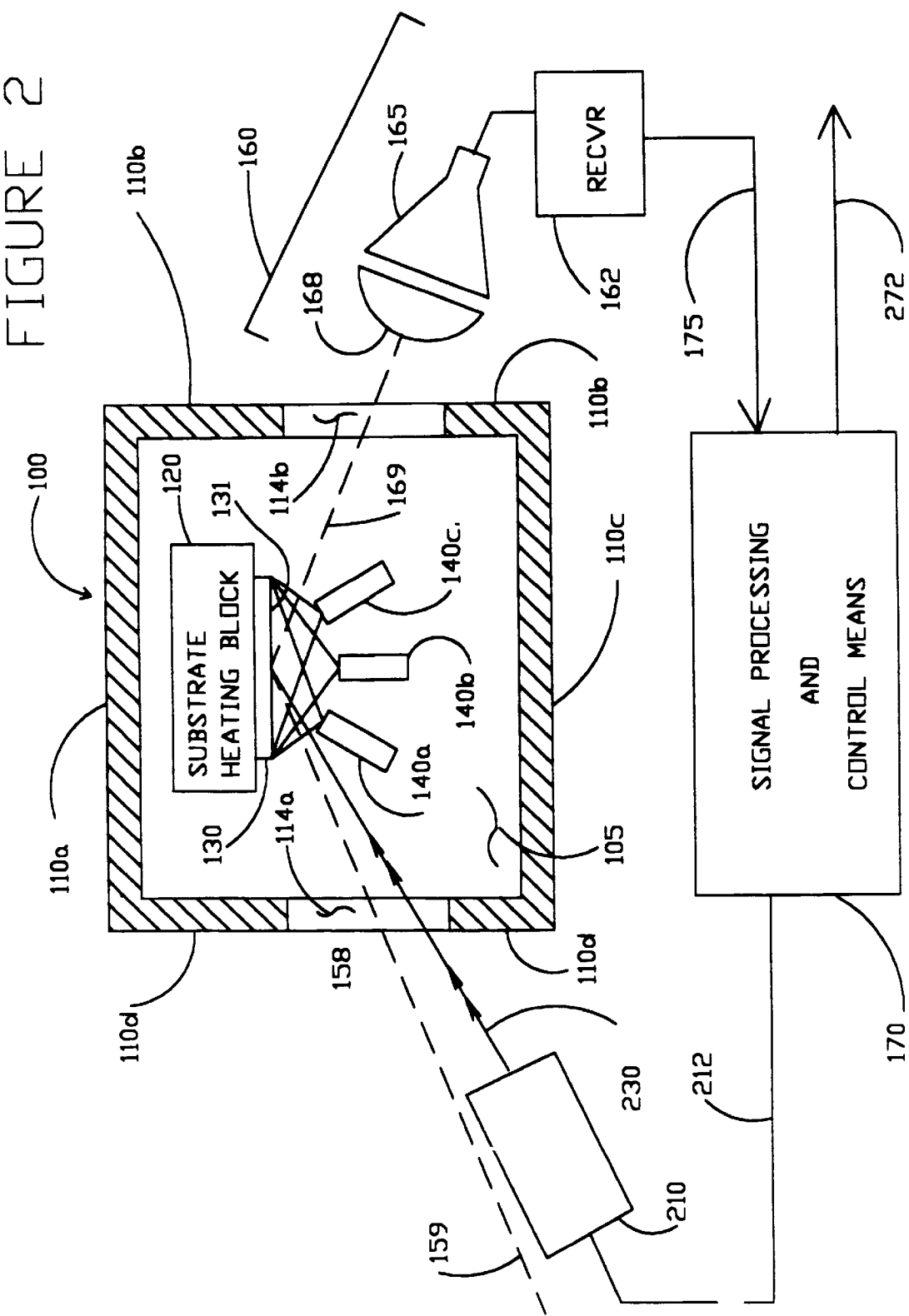
FIG. 2 is substantially FIG. 1 with light generating components added thereto in accordance with the present invention.

FIG. 2, similar to FIG. 1, depicts a non-invasive semiconductor wafer monitoring apparatus intended for monitoring carrier lifetime of a semiconductor wafer during sample fabrication in accordance with the present invention. FIG. 2 includes all of the same components as FIG. 1. However the focused beam wave generator 150 and associated components of FIG. 1 have not been shown in FIG. 2 so as to accommodate additional components and illustrate particular aspects of the present invention beyond those of FIG. 1 without obfuscating.

As before, fabrication chamber 105 encloses wafer substrate 130 and includes view ports 114a and 114b, and includes vapor sources 140a–c for depositing or growing materials gown on planar surface 131 of wafer substrate 130, for example, by epitaxial growth, in real-time. Also shown in FIG. 2 is a light source 210 for generating photon energy as generally depicted by light beam 230. Signal processing and control means 170 further provides an output control signal line 212 which is coupled to light beam source 210, and an output signal depicted by numeral 272 generally indicative of carrier life time as will be more fully described.

As should be understood by those skilled in the art, if light is directed toward a semiconductor surface, for example planar surface 131, and the incident light has particular wavelength components to produce photon energy greater than the bandgap of the semiconductor wafer substrate and/or materials, then the incident photons of those particular wavelength components will be absorbed by the semiconductor substrate through the process of hole-electron pair generation. Hole-electron pairs are generally referred to as "excess carriers." Further, when the light is removed, these so called excess carriers will exhibit a "carrier lifetime." That is, an electron is likely to recombine with a hole after a characteristic time period. When the light is removed the population of excess carriers will decay toward a natural state of zero. The carrier lifetime of a semiconductor is an important semiconductor characteristic, and it is especially valuable to know or monitor the carrier lifetime during fabrication so that certain deposition action may be taken to improve the quality of the fabrication process and increase semiconductor sample yields.

As should be further understood by those skilled in the art, excess carriers in the semiconductor substrate results in an increase in sheet conductivity of the semiconductor substrate and corresponding decrease in the sheet resistivity which may be monitored. Furthermore, the sheet resistivity may be monitored in a manner as that already described with reference to FIG. 1.

In accordance with present invention, light source 210 is arranged so as to generate light in a manner so as to pass through viewport 114a and impinge upon planar surface 131 of wafer substrate 130, preferably at substantially the same general spatial location that incident beam 159 impinges thereon. This light is generally depicted in FIG. 2 by light beam 230.

As aforesaid, light source 210 is required to produce photon energy greater than the band gap of the semiconductor wafer material by having particular wavelength components. In other words, the wavelength of the incident light beam 230 needs to be short enough such that the corresponding photon energy is great enough to create hole-electron pairs in the semiconductor under consideration. For a GaAs semiconductor 130, the absorption edge is 880 nm. Consequently, all or at least a portion of the spectrum of the incident light beam 230 needs to have some components with wavelengths less than 880 nm. This requirement may be satisfied by employment of a xenon flash lamp, among others, which generates a continuous wavelength spectrum characteristic in the range of 400 nm to 800 nm. It is also satisfied by a AlGaAs semiconductor laser which generates light having a well defined spectral line at 830 nm.

In the preferred embodiment of the present invention, light pulses are required so that carrier lifetime may be monitored—i.e., the decay of the excess carriers is intended to occur. Light source 210 is intended to produced pulsed light, i.e., light beam 230 being incident upon substrate 130 for selected "on" an "off" times. In turn, decay in excess carriers may be monitored by monitoring the dynamic—time responsive—sheet resistivity characteristic as characterized by the simply monitoring the dynamic response of the reflected beam 169 to changes in light beam 230 from light on to light off conditions. Therefore, in accordance with present invention, light source 210 should have very fast fall or extinguish times—less than 1 pico-sec so that the photogenerated excess carriers may be resolved. That is, the decay times for the excess carries concentration in the semiconductor substrate may be in the order of a few picoseconds or more so that the light beam 230 has to be extinguished much faster than this excess carrier decay time.

Further, In order to avoid any deleterious effects on the fabrication process or sheet resistivity monitoring process, the pulse duration—i.e., light on and light off times—should be small and the duty factor should be low. This is so, since the photon energy may cause heating of the semiconductor substrate. In turn, the semiconductor substrate conductivity and corresponding sheet resistivity may be erroneous—particularly exhibited by an erroneous reflected beam 159 dynamic characteristic (power, etc.). Also, the sample may be damaged by excessive heating. As an example of a preferred light source, light pulses of a few milliseconds and duty factor of less than 1% should provide adequate excess carrier generation without undue heating of the semiconductor substrate.

The light source 210 requirements as described above are preferably met by a laser source. A first advantage of a laser source in accordance with the present invention is that the light output may be easily collimated from outside the fabrication chamber 105 and transmitted and directed as a narrow beam of light to pass through viewport 114a and impinge upon substrate 130. Accordingly, illumination of the substrate may be limited to only a small portion of the wafer substrate 130. Secondly, it may be easily controlled to provide the intended pulses of duration as already described, and also have the required extinguish or fall times so that proper measurement made be made in a manner as will be further described.

It should be noted that in FIG. 2 that the angle of incidence of incident beam 159 and light beam 230 are at different incident oblique angles. However, in practice of the present invention, the incident angles are dictated more by the design constraints of the fabrication chamber and viewport size, and less critical is there relationship. As is well understood, the larger the incident angle, the more focused will be the energy that will be directed toward the substrate by both the light beam 230 as well as the incident beam 159.

The following is a limited mathematical analysis to express the correlation factor to determine sheet carrier lifetime (excess carrier lifetime) vs. sheet resistivity vs. time. Before proceeding it should be understood that an exact formula is difficult to recite since the excess carrier decay time may be influenced by a number of factors including, among others, absorption (depth of light), surface recombination velocity, types and density of trap levels, sample thickness, and the like. However, since photo conductance is proportional to the reciprocal of the relative sheet resistivity, a basic form of the transient response for the relative photo conductance may be written as:

$$\sigma C(t)/C_0 = \Sigma C_m e^{1/t_m}$$

where $C_m$ is the amplitude of the $m^{th}$ decay mode, and where each exponential time constant may be expressed as:

$$1/t_m = 1/t_0 + (\sigma_m)^2 D_p$$

If the logarithm of the photo conductance response is plotted as a function of time, a straight line approximation may be obtained after the effects of the higher order mode terms have died out. The slope of this line is $1/t_0$, where:

$$1/t_0 = 1/t_p + (\alpha_0)^2 D_p$$

The first term in the last expression represents the effect of bulk recombination (the desired observable), the second term represents the effect of surface recombination.

For wafer substrate samples having similar surface recombination velocities, a relative measure of the carrier life time or characteristic decay may thus be measured for the bulk semiconductor substrate.

In order to obtain the excess carrier lifetime, signal processing and control means 170 provides further functions beyond that as already described with reference to FIG. 1. More specifically, signal processing and control means 170 includes a high speed digitizing function for operating on the output signal of receiver 162 on signal line 175, and capturing or sampling the dynamic response of the sheet resistivity as indicated by the output of signal receiver 162. It should be noted that the ratio of the incident beam 159 and reflected beam 169 is not as important here, but rather the dynamic response to the on and off conditions of the pulsed light energy as provided by light source 210 and corresponding light beam 230.

In accordance with the present invention, signal processing and control means 170 further includes control means for providing a light source control signal as an input control signal on signal line 212 for slight source 210, and simultaneously synchronizing therewith the received signal information on signal line 175 from receiver 162 for obtaining digitized information descriptive of the dynamic response of the output of receiver 162 for purposes of signal analysis—including determination of rate of signal decay and corresponding time constant after the light beam 230 has been changed from a light on condition to a light off condition so that carrier life time may be obtained in a manner as mathematically described above.

As before, signal processing and control means 170 may include a microprocessor, computer, or the like for providing the intended control functions and corresponding signal analysis as already described, the details of which are well known to those skilled in the art, and have not been described herein so as not obfuscate the present invention with burdensome detail. Signal processing and control means 170 may be provided by a variety of techniques and components for achieving the intended functions as described above. These functions may be achieved, of course, by a wide array of software and firmware, all of which are known to those skilled in the are of control and system and analysis development.

It also should be understood that the output signal from receiver 162 may be provided as an input to a sampling scope (not shown) which in turn is capable of digitizing the received signal information on signal line 175 from receiver 162, as is well known. In turn, the digitized information may be provided as an input to signal processing and control means 170 for processing the digitized information for determining the life time carrier information in a manner as already mathematically described.

The foregoing description of the invention is necessarily detailed so as to provide understanding of the invention's best mode of practice. It is to be understood, however, that various modifications of detail, rearrangement, addition, and deletion of components may be undertaken without departing from the invention's spirit, scope, or essence.

In accordance with the present invention, all components including electronics, antenna, and the like are external to the fabrication chamber. No internal modifications are introduced inside the fabrication chamber. Accordingly, practice of the method of the monitoring system in accordance with present invention ensures unaffected and predictable growth characteristics when applied to existing or new fabrication chambers for epitaxial growth systems or other type of deposition systems, including molecular beam and ion beam deposition systems.

Mathematical analyses have been provided herein to enhance the reader's understanding of the present invention. However, other mathematical techniques may be employed without departing from the true spirit and scope of the present invention.

Further, although in the preferred embodiment of the invention a simple incident focused beam 159 was generated at mm-wave frequencies, others are of course possible including amplitude modulation, pulse width modulated waves, differing frequencies, phase modulation, and the like. As used herein, a focused beam or collimated beam have substantially equivalent means, both of which are interchangeable within the meaning of the following claims.

The Figures have illustrated only one type of fabrication chamber generally referred to in the art as an "MBE" fabrication chamber. Other types of fabrication chambers, for example those referred to in the art as "MOCVD", are of course possible alternatives, all of which are intended to be within the true spirit and scope of the accompanying claims.

Various schemes may, of course, be employed for generating the incident beam electromagnetic wave beam 159 and producing a reflected electromagnetic wave beam 169 from the wafer semiconductor beyond that illustrated in the Figures. For example, as already indicated, window 114*b* may alternatively be replace by a mirror (not shown) and the transmitting antenna 155 may also serve as a receiving antenna by utilizing directional coupling techniques, and the like (not shown).

Lastly, light source 210 may be provided by a wide array of components and schemes, all of which are intended to be within the true spirit and scope of the present invention for providing an monitoring apparatus and method for obtaining carrier lifetime information for a semiconductor sample during fabrication.

The embodiments of an invention in which an exclusive property or right is claimed are defined as follows:

1. A non-destructive method for monitoring the carrier lifetime characteristic of a fabricated semiconductor sample selectively before and during the fabrication process where selected materials are deposited on a planar surface of a semiconductor wafer substrate in a fabrication chamber, the method comprising the steps of:

providing a first viewport in a wall of said fabrication chamber where said viewport is in the line-of-site of said planar surface of said wafer substrate, and is capable of passing electromagnetic waves therethrough;

generating a focused electromagnetic wave having a nominal frequency and corresponding nominal wavelength, and in which said focused electromagnetic wave is generated external to said fabrication chamber;

directing said focused electromagnetic wave to pass through said first viewport and impinge upon a selected portion of said planar surface of said wafer substrate at an oblique incident angle relative to said planar surface of said wafer substrate;

providing a second viewport in a wall of said fabrication chamber where said viewport is in a position to pass a reflected electromagnetic wave emanating from said planar surface of said wafer substrate, where said reflected electromagnetic wave is the resultant reflection of said focused electromagnetic wave impinging on said planar surface of said wafer substrate;

generating light having wavelength components capable of generating hole-electron pairs in said wafer substrate, and in which said light is generated external to said fabrication chamber, and is capable of being varied between light on and light off conditions;

directing at least a portion of said light to pass through said first viewport and impinge upon a selected portion of said planar surface of said wafer substrate at an oblique incident angle relative to said planar surface of said wafer substrate; and determining, as a function of the dynamic response of said reflected electromagnetic wave in response to said light being varied between light on and light off conditions, at least one characteristic of said dynamic response representative of said carrier lifetime characteristic of said fabricated semiconductor sample.

2. The method of claim 1 wherein said at least one characteristic of said dynamic response is the time constant associated with said dynamic response as determined from the response of said reflected electromagnetic wave from a condition where light is changed from an on condition to an off condition.

3. The method of claim 1 where said light is generated from a laser source capable of producing a light beam directed to pass through said first viewport and impinge upon said planar surface of said wafer substrate at an oblique angle thereto.

4. The method of claim 1 where said light is generated from a xenon flash lamp.

5. The method of claim 1 wherein said electromagnetic wave has a frequency value in the mm-wave frequency range.

6. The method of claim 1 wherein said first and second viewports have a thickness substantially equal to an integral number of half wavelengths of said nominal wavelength of said electromagnetic wave.

7. The method of claim 1 wherein said first and second viewports are constructed of a quartz or sapphire like material.

8. An apparatus for non-invasive monitoring of a selected wafer characteristic of a fabricated sample during deposition of selected materials on a planar surface of a semiconductor wafer substrate in a fabrication chamber, the apparatus comprising:

a first viewport in a wall of said fabrication chamber where said viewport is in the line-of-site of said planar surface of said wafer substrate, and is capable of passing electromagnetic waves therethrough;

an electromagnetic wave generator, external to said fabrication chamber, for generating an electromagnetic wave having a nominal frequency and corresponding nominal wavelength;

means for producing a focused electromagnetic wave from said electromagnetic wave and directing said focused electromagnetic wave to pass through said first viewport and impinge upon a selected portion of said planar surface of said wafer substrate at an oblique incident angle relative to said planar surface of said wafer substrate;

a second viewport in a wall of said fabrication chamber and in which said second viewport is positioned so as to be capable of passing, therethrough, a reflected electromagnetic wave emanating from said planar surface of said wafer substrate, where said reflected electromagnetic wave is the resultant reflection of said focused electromagnetic wave impinging on said planar surface of said wafer substrate;

receiver means for detecting said reflected electromagnetic wave and providing a reflected wave output signal representative of said reflected electromagnetic wave;

a light source for generating light having wavelength components capable of generating hole-electron pairs in said wafer substrate, and in which said light source is external to said fabrication chamber and includes input signal means responsive to a command signal for selectively varying between light on and light off conditions, said light source further configured and spatially located relative to said wafer substrate such that at least a portion of said light passes through said first viewport and impinge upon a selected portion of said planar surface of said wafer substrate at an oblique incident angle relative to said planar surface of said wafer substrate; and signal processing and control means operative for receiving said reflected wave output signal and determining, as a function of the dynamic response of said reflected electromagnetic wave in response to said light being varied between light on and light off conditions, at least one characteristic of said dynamic response representative of said carrier lifetime characteristic of said fabricated semiconductor sample.

9. The apparatus of claim 8 wherein said signal processing means includes means responsive to said reflected wave output signal for calculating sheet resistivity of said fabricated sample during epitaxial layer growth of one or more materials on said planar surface of said wafer substrate.

10. The apparatus of claim 8 wherein said signal processing means includes means for digitizing and analyzing the dynamic response of said reflected electromagnetic wave output signal for determining at least one selected time constant characteristic of said dynamic response in response to said light varying from an on condition to an off condition, where said one selected time constant is representative of said carrier lifetime characteristic of said fabricated semiconductor sample.

11. The apparatus of claim 8 wherein said electromagnetic wave has a frequency value in the mm-wave frequency range.

12. The apparatus of claim 8 wherein each of said first and second viewports have a thickness substantially equal to an integral number of half wavelengths of said nominal wavelength of said electromagnetic wave.

13. The apparatus of claim 8 wherein said first and second viewports are constructed of a quartz or sapphire like material.

14. The apparatus of claim 8 wherein said first and second viewports are the same viewport.

* * * * *